(12) United States Patent
Chan et al.

(10) Patent No.: US 12,014,961 B2
(45) Date of Patent: Jun. 18, 2024

(54) METHOD OF SEMICONDUCTOR OVERLAY MEASURING AND METHOD OF SEMICONDUCTOR STRUCTURE MANUFACTURING

(71) Applicant: NANYA TECHNOLOGY CORPORATION, New Taipei (TW)

(72) Inventors: Kai-Ping Chan, Taoyuan (TW); Tsu-Wen Huang, Taoyuan (TW); Kai Lee, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 589 days.

(21) Appl. No.: 17/233,560

(22) Filed: Apr. 19, 2021

(65) Prior Publication Data

US 2022/0336292 A1 Oct. 20, 2022

(51) Int. Cl.
*H01L 21/66* (2006.01)
*G03F 7/00* (2006.01)
(Continued)

(52) U.S. Cl.
CPC .......... *H01L 22/12* (2013.01); *G03F 7/70633* (2013.01); *G06T 7/001* (2013.01); *H01L 21/7685* (2013.01); *H01L 23/544* (2013.01); *H01L 28/91* (2013.01); *H10B 12/033* (2023.02); *H01L 2223/54426* (2013.01)

(58) Field of Classification Search
CPC ... H01L 21/66; H01L 21/768; H01L 21/7685; H01L 22/12; H01L 22/00; H01L 22/34; H01L 23/544; H01L 23/52; H01L 23/00; H01L 28/91; H01L 28/90; H01L 28/92; H01L 28/60; H01L 2223/54426; H01L 2223/54433; H01L 2223/544; H01L 21/76849; H01L 22/14; H01L 2223/54473; H01L 2223/54453; G03F 7/70633; G03F 7/00; G03F 7/20; G06T 7/74; G06T 7/001; G06T 7/00; G06T 7/73; G06T 2207/30148; G06T 2207/30108; G06T 2207/00; H10B 12/033; H10B 12/00; H10B 12/20; H10B 12/09
See application file for complete search history.

(56) References Cited

U.S. PATENT DOCUMENTS 8,273,610 B2 * 9/2012 Or-Bach .......... H01L 21/823828
257/E23.101
10,473,460 B2 * 11/2019 Gutman ................ G01B 15/00
(Continued)

*Primary Examiner* — Nikolay K Yushin
(74) *Attorney, Agent, or Firm* — CKC & Partners Co., LLC

(57) ABSTRACT

A method of semiconductor overlay measuring includes following operations. Provide a test substrate. Conductive structures are located in the test substrate and exposed from a top surface of the test substrate. Positioning the test substrate to a standard position and capturing a first image of the top surface of the test substrate. Mark first marks corresponding to the exposed conductive structures on the first image. Form a test capping layer with capacitor openings on the top surface of the test substrate. Move the test substrate to the standard position and capturing a second image of a top surface of the test capping layer. Identify the capacitor openings on the second image with second marks. Compare the first marks with the second marks to determine a position offset between the test substrate and the test capping layer.

15 Claims, 10 Drawing Sheets

(51) Int. Cl.
*G06T 7/00* (2017.01)
*H01L 21/768* (2006.01)
*H01L 23/544* (2006.01)
*H01L 49/02* (2006.01)
*H10B 12/00* (2023.01)

(56) References Cited

U.S. PATENT DOCUMENTS

| | | | |
|---|---|---|---|
| 10,510,782 B2* | 12/2019 | Chen | H10K 71/00 |
| 11,119,416 B2* | 9/2021 | Sun | G03F 7/70625 |
| 2013/0208279 A1* | 8/2013 | Smith | G01B 11/26 |
| | | | 356/401 |
| 2014/0240703 A1* | 8/2014 | Lee | G03F 7/70633 |
| | | | 356/401 |
| 2016/0313652 A1* | 10/2016 | Liou | G03F 1/70 |
| 2018/0348586 A1* | 12/2018 | Li | H01L 21/76894 |
| 2019/0178639 A1* | 6/2019 | Gutman | G01B 15/00 |
| 2020/0057388 A1* | 2/2020 | Sun | G03F 7/7065 |
| 2021/0382402 A1* | 12/2021 | Ma | G03F 7/70683 |
| 2021/0407073 A1* | 12/2021 | Yati | G06T 7/0004 |
| 2022/0013468 A1* | 1/2022 | Volkovich | G01B 21/22 |

* cited by examiner

METHOD OF SEMICONDUCTOR OVERLAY MEASURING AND METHOD OF SEMICONDUCTOR STRUCTURE MANUFACTURING

BACKGROUND

Field of Invention

The present disclosure relates to method of semiconductor overlay measuring and method of semiconductor structure manufacturing.

Description of Related Art

A memory unit of a semiconductor DRAM structure can be formed by an active region, a layer capping the active region and a capacitor formed within the layer. The capacitor should be aligned with the active region. However, the layer capping the active region has a large thickness, so that it is difficult to measure alignment between the active region and the capacitor.

Therefore, how to provide a solution for alignment for such overlay structure is one of the subjects to be solved for the industry.

SUMMARY

One aspect of the present disclosure is relative to a semiconductor structure.

An aspect of the present disclosure is related to a method of overlay measuring.

According to one embodiment of the present disclosure, a method of semiconductor overlay measuring includes following operations. Providing a test substrate. A plurality of conductive structures are located in the test substrate and exposed from a top surface of the test substrate. Positioning the test substrate to a standard position and capturing a first image of the top surface of the test substrate. Mark a plurality of first marks on the first image. The first marks correspond to the exposed conductive structures within the test substrate. Form a test capping layer on the top surface of the test substrate. The test capping layer has a plurality of capacitor openings. Move the test substrate to the standard position and capturing a second image of a top surface of the test capping layer. Identify the capacitor openings on the second image with a plurality of second marks. Compare the first marks with the second marks to determine a position offset between the test substrate and the test capping layer.

In one or more embodiments of the present disclosure, the first marks correspond to profiles of the exposed conductive structures on the test substrate. The second marks correspond to profiles of the capacitor opening.

In one or more embodiments of the present disclosure, the first and second images are captured by an electronic microscope.

In one or more embodiments of the present disclosure, the second marks are identified through a pattern recognition process.

In one or more embodiments of the present disclosure, the exposed conductive structures are arranged in rows extending along a first direction. The rows are arranged in a second direction perpendicular to the first direction. The operation of marking the first marks on the first image further includes following operations. Mark reference frames arranged on a straight line along one of the first and second directions. Mark the first marks according to the reference frames.

In some embodiments, the operation of comparing the first marks with the second marks includes following operations. Mark the reference frames on the second image. Mark the first marks on the second image according the reference frames.

In one or more embodiments of the present disclosure, the conductive structures are surrounded by streets, and measuring marks are located in the street.

In some embodiments, the standard position of the test substrate is defined by the measuring marks.

An aspect of the present disclosure is related to a method of semiconductor structure manufacturing.

According to one embodiment of the present disclosure, a method of semiconductor structure manufacturing includes following operations. Processing the mentioned method of overlay measuring to have the position offset. Provide a substrate with exposed conductive structures in the standard position and forming a capping layer over the substrate. The capping layer is provided by an apparatus used to form the test capping layer. The position offset is received by the apparatus, so that capacitor openings of the capping layer are respectively aligned with the conductive structures exposed from a top surface of the substrate. The capacitor openings extend along a direction perpendicular to the top surface of the substrate.

In one or more embodiments of the present disclosure, each of the conductive structures of the substrate comprising an active area within the substrate and a metal contact connected to the active area and exposed from the top surface of the substrate.

In one or more embodiments of the present disclosure, the method of semiconductor structure manufacturing further includes following operations. Form capacitors in the capacitor openings of the substrate. The capacitors extend along the first direction in which the capacitor openings extend.

In some embodiments, each of the capacitors includes a dielectric container and a conductive material. The dielectric container is formed within a corresponding one of the capacitor opening and covering a corresponding one of the exposed conductive structures of the substrate. The conductive material is filled with the dielectric container.

In some embodiments, the conductive structures comprise transistors, the capacitors are connected to the transistor respectively to form memory units.

In one or more embodiments of the present disclosure, the capping layer comprises dielectric material.

In one or more embodiments of the present disclosure, the conductive structures on the substrate are surrounded by streets. Measuring marks are located in the streets.

In summary, position offset between the conductive structures and the capping layer can be obtained through the measuring method of the present disclosure, and the position offset can be further used to fix the error of the apparatus forming the capping layer.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1:
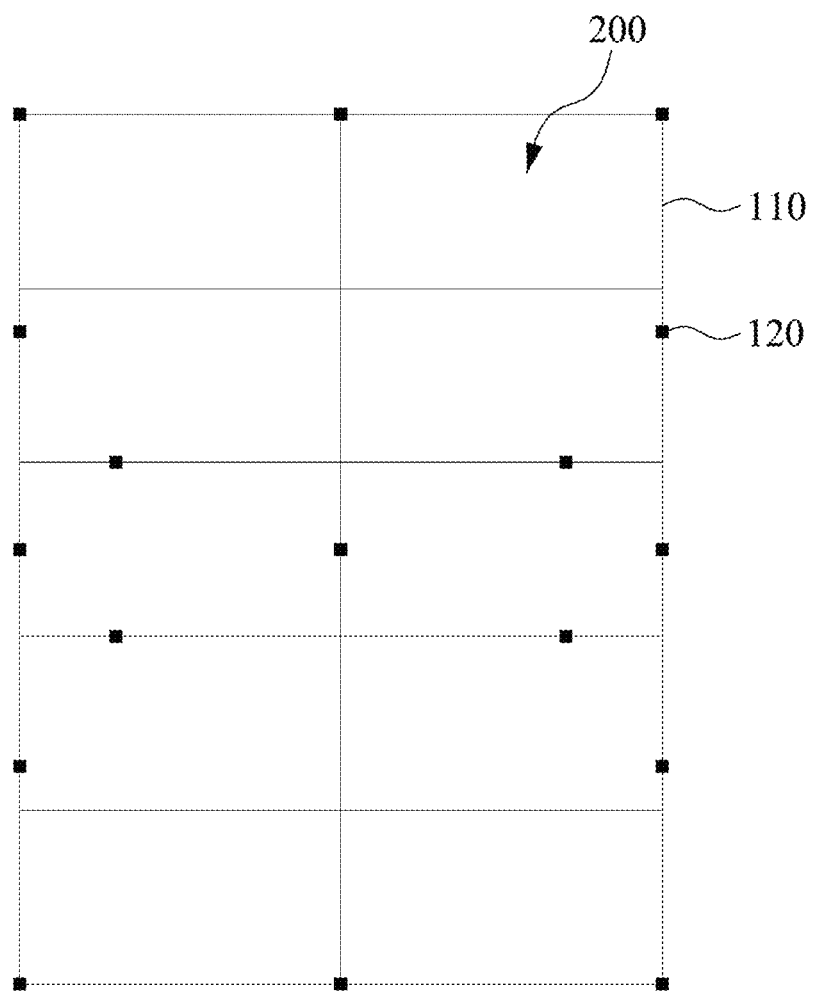
FIG. 1 illustrates a schematic top view of a semiconductor wafer according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Reference is made in FIG. 1. FIG. 1 illustrates a schematic top view of a semiconductor wafer 100 according to one embodiment of the present disclosure. A plurality of semiconductor structures formed on the semiconductor wafer 100 and schematic illustrated in FIG. 1.

In this embodiment, the semiconductor wafer 100 can be regarded as a test wafer. The test wafer is used to determine a position offset of overlay structures.

In FIG. 1, streets 110 are formed on the semiconductor wafer 100. A plurality of DRAM arrays 200 formed on the semiconductor wafer 100 and surrounded by the streets 110. For the purpose of description, only positions in which the DRAM arrays 200 are located on are illustrated. Each of the DRAM arrays 200 located on a local substrate, which is defined by an enclosed region surrounded by the streets 110. The DRAM arrays 200 can be separated from each other by trimming the streets 110.

Figure 2:
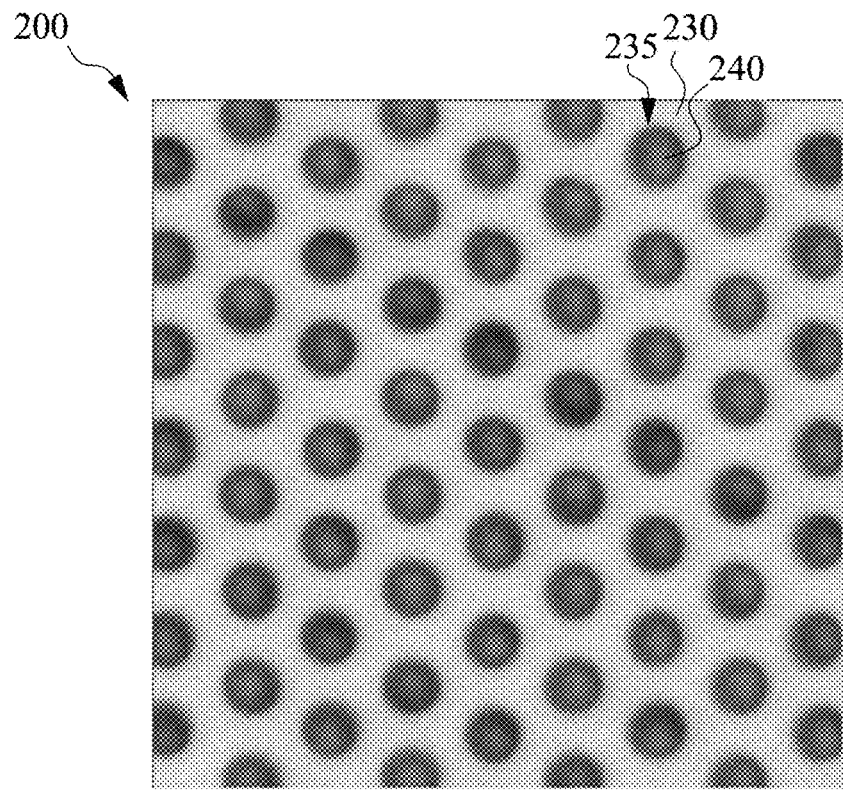
FIG. 2 illustrates a top view of a DRAM array according to one embodiment of the present disclosure.

For the detailed structure of the DRAM arrays 200, please refer to the following FIG. 2. FIG. 2 illustrates a top view of a DRAM array 200 according to one embodiment of the present disclosure. FIG. 2 shows a local view of the DRAM array 200 surrounded by the street 110. For the purpose of simplified description, the streets 110 are not shown in FIG. 2.

In this embodiment, FIG. 2 is an image captured by an electron microscope. An electron microscope can be configured to capture a structure with a small size. In this embodiment, FIG. 2 is the image captured by a scanning electron microscope (SEM).

As shown in FIG. 2, in this embodiment, the DRAM array 200 includes a plurality of capacitors 240. Specifically, the DRAM array 200 can be formed by conductive structures and the capacitors 240. The conductive structures can be formed on a local substrate on the semiconductor wafer 100 and be connected to the capacitors 240. In FIG. 2, the DRAM array 200 includes a capping layer 230 covering the local substrate with conductive structures. The capping layer 230 includes a plurality of capacitor openings 235. The capacitors 240 are formed in the capacitor openings 235. Once the capacitor openings 235 are aligned with the conductive structures respectively, the formed capacitors 240 are also aligned with the conductive structures.

Figure 3:
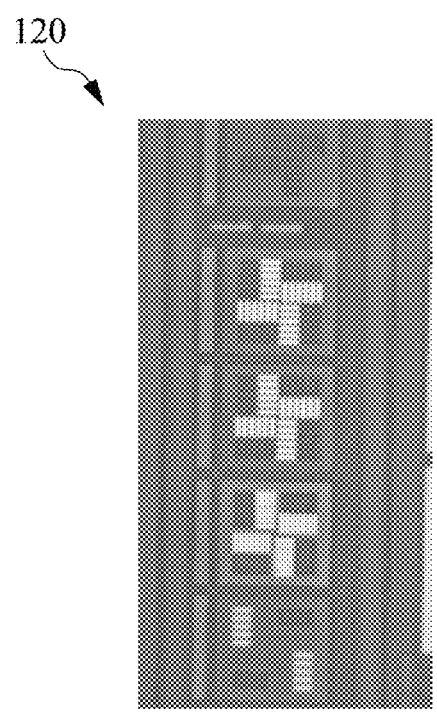
FIG. 3 illustrates a top view of measuring marks according to one embodiment of the present disclosure.

Return to FIG. 1. As shown in FIG. 1, in this embodiment, a plurality of measuring marks 120 formed within the streets 110. The measuring marks 120 are used to determine whether an offset between the local substrate and the capping layer is exist. FIG. 3 illustrates a top view of measuring marks 120 according to one embodiment of the present disclosure.

The measuring marks 120 can be used to perform stacking offset between two layers in the formed substrate of the semiconductor wafer 100. It difficult to determine whether the capacitor openings 235 is aligned with the exposed conductive structures since the size of the capacitor openings 235 are small. However, in some embodiments of the present disclosure, the measuring marks 120 can be used as a standard of the substrate, so that the substrate can be moved back to the original position according to the measuring marks 120.

To realize the alignment of the capacitors 240 and the conductive structures formed on the local substrate of the semiconductor wafer 100, a method of overlay measuring is provided in the present disclosure.

Figure 4:
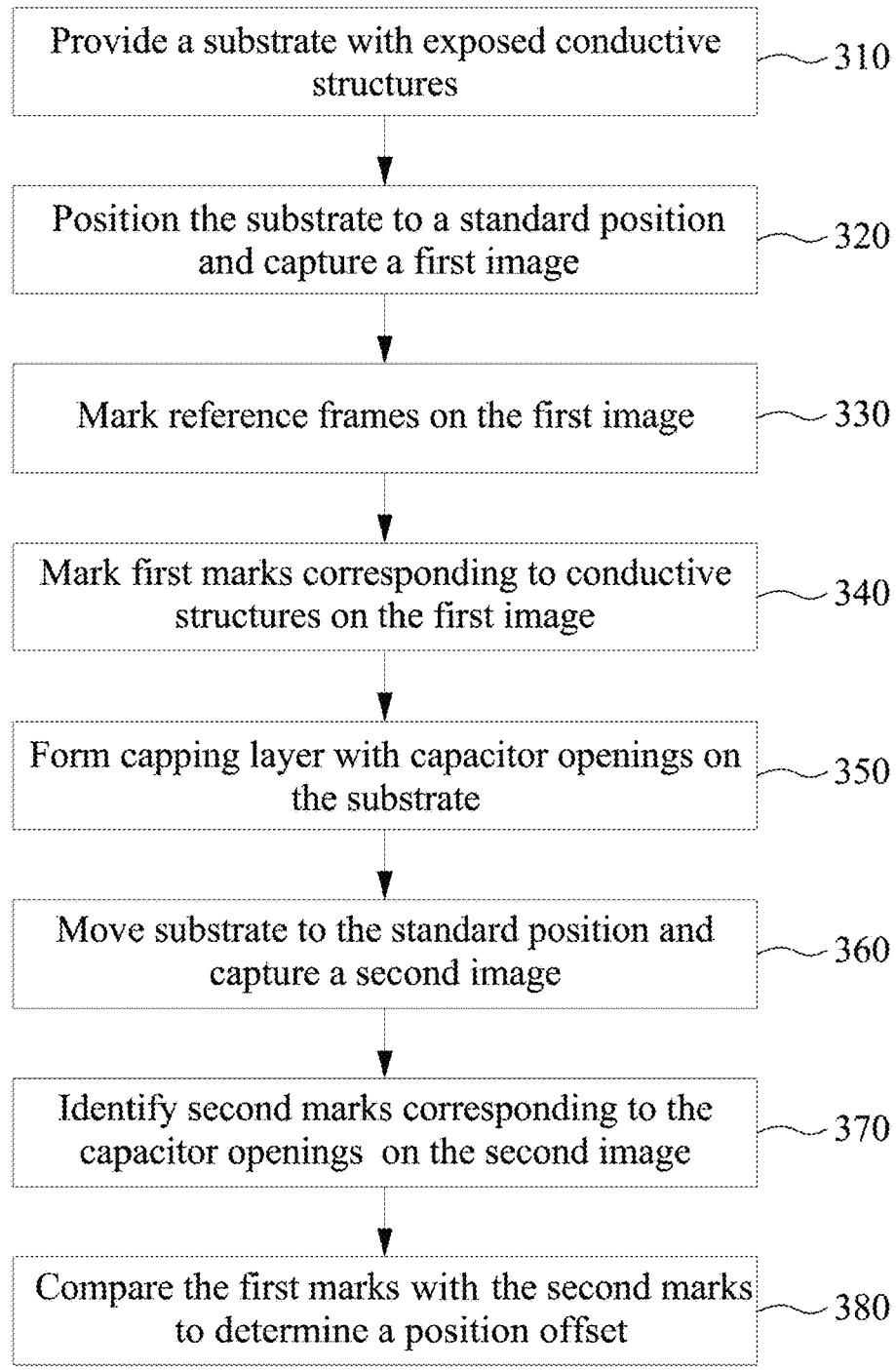
FIG. 4 illustrates a flow chart of a method of overlay measuring according to one embodiment of the present disclosure.
Figure 5:
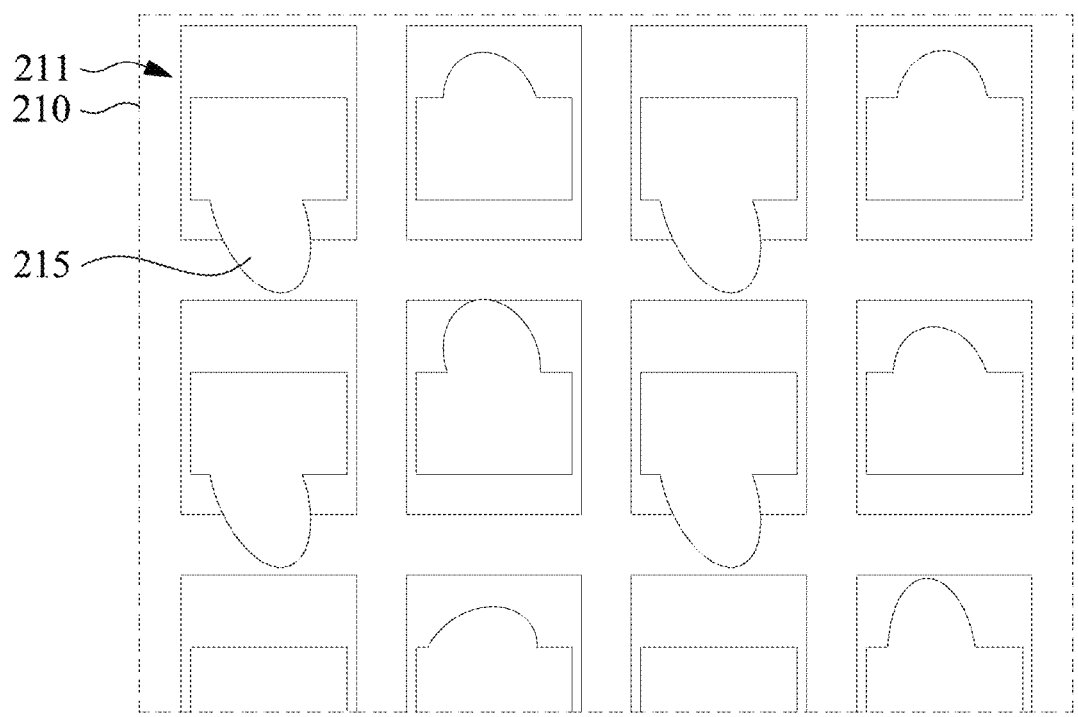
FIG. 5 illustrates a schematic view of a first image according to one embodiment of the present disclosure.
Figure 6:
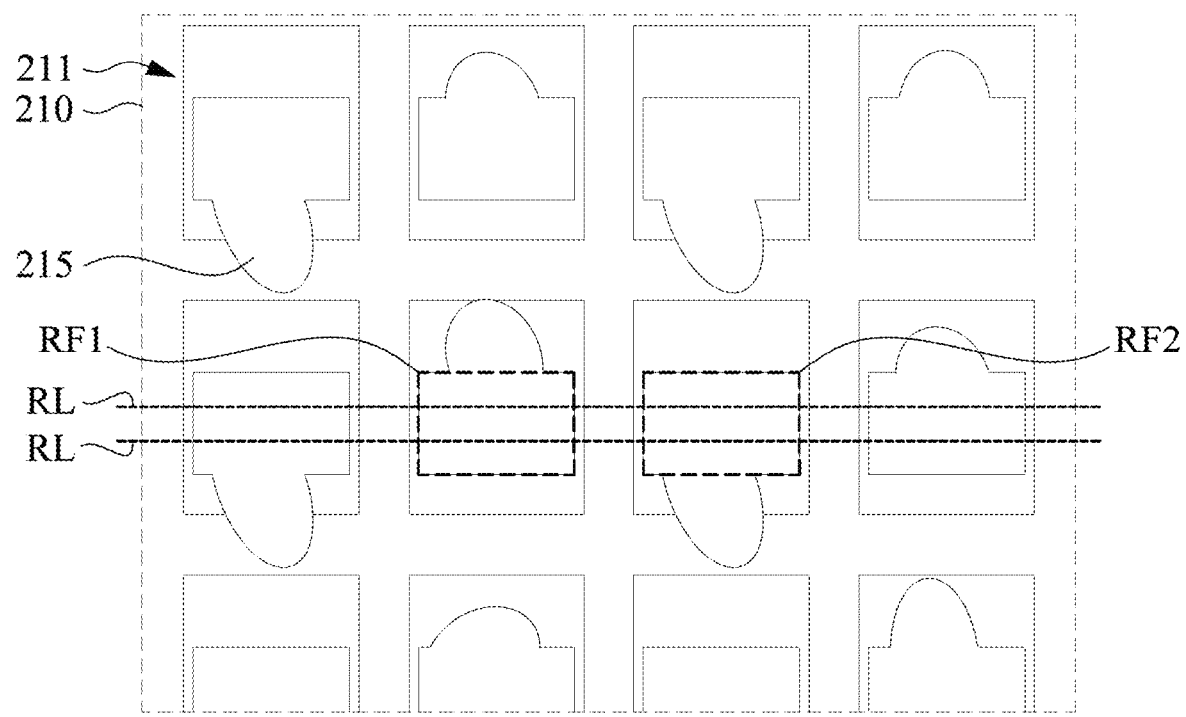
FIG. 6 and FIG. 7A illustrate marking first marks on the first image in middle stages according to embodiments of the present disclosure.
Figure 7A:
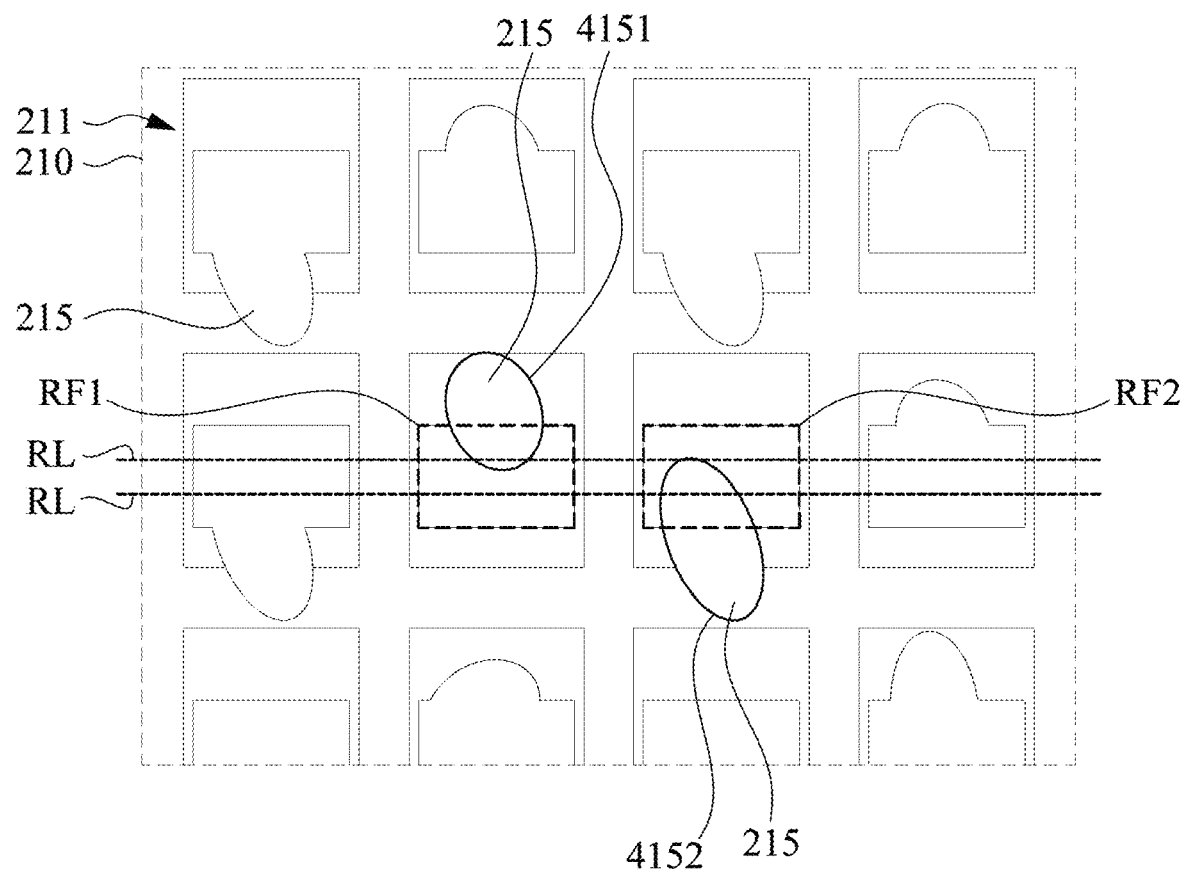
Figure 7B:
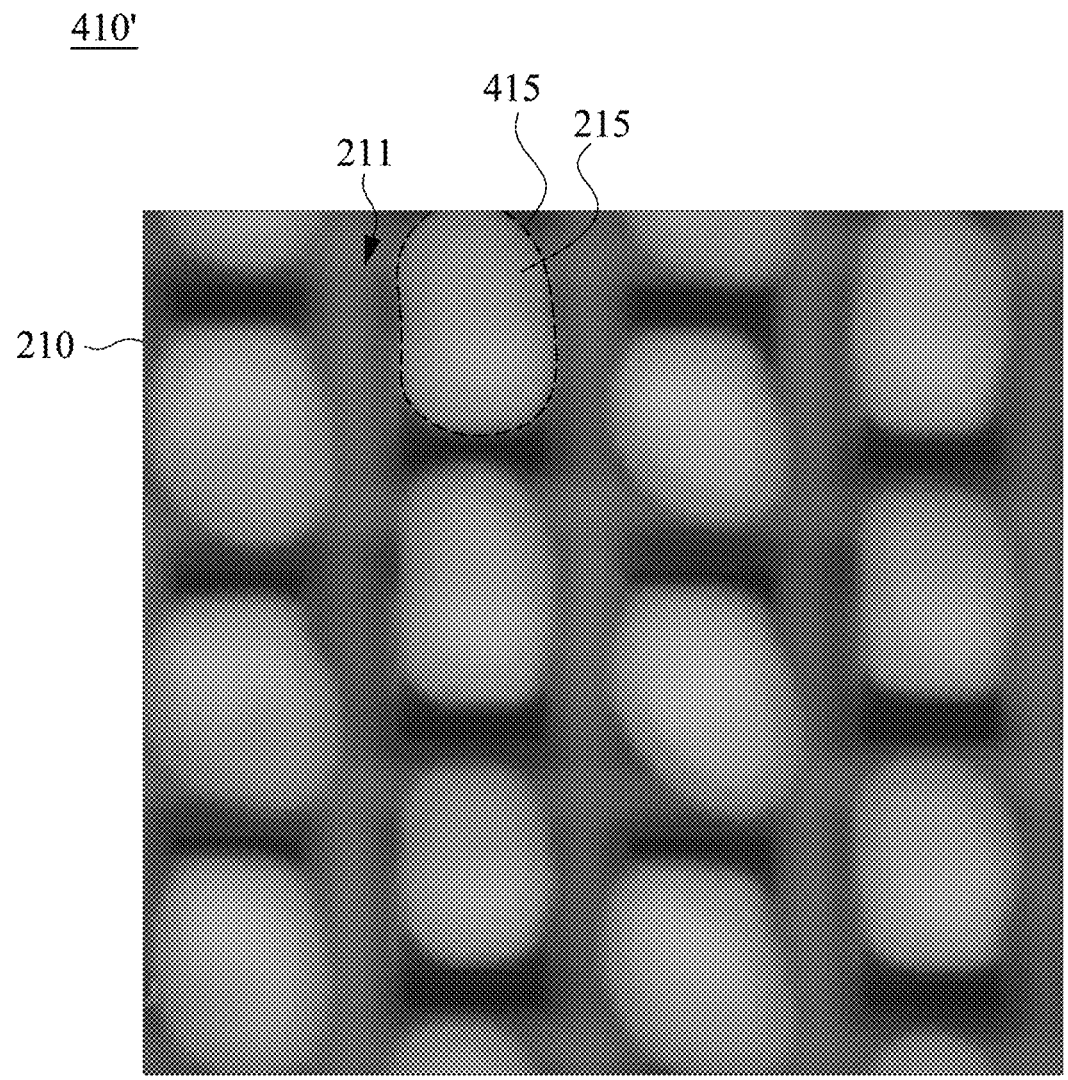
FIG. 7B illustrates a schematic view of another first image with first marks according to one embodiment of the present disclosure.
Figure 8:
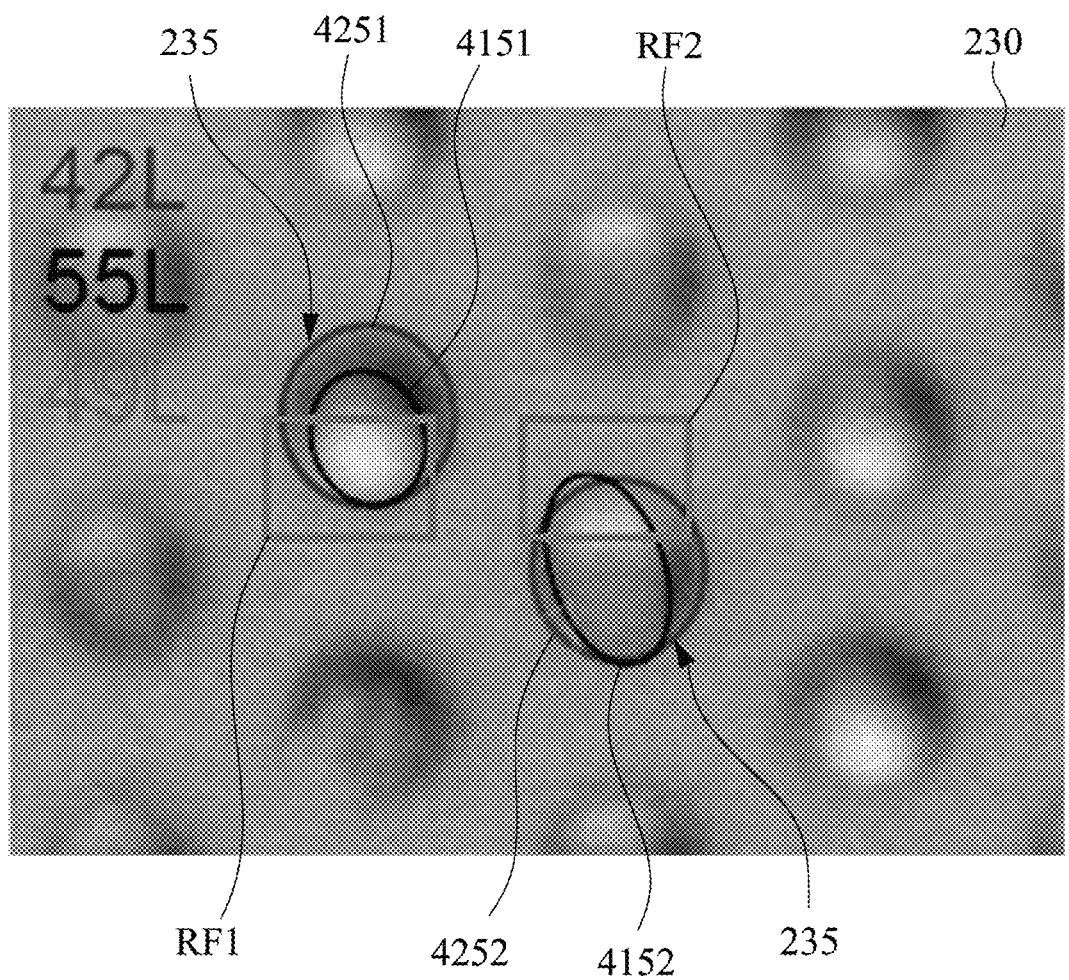
FIG. 8 illustrates a second image according to one embodiment of the present disclosure.

Reference is made in FIG. 4. FIG. 4 illustrates a flow chart of a method 300 of overlay measuring according to one embodiment of the present disclosure. Also refer to FIGS. 5-8 correspondingly. FIG. 5 illustrates a schematic view of a first image 410 according to one embodiment of the present disclosure. FIG. 6 and FIG. 7A illustrate marking first marks on the first image 415 in middle stages according to embodiments of the present disclosure. FIG. 7B illustrates a schematic view of another first image 410' with first marks 410 according to one embodiment of the present disclosure. FIG. 8 illustrates a second image 420 according to one embodiment of the present disclosure.

The method 300 of overlay measuring includes operations 310-380. In operation 310, a substrate 210 with exposed conductive structures 215 is provided. Then, proceed to operation 320, the substrate 210 is positioned to a standard position, and a first image 410 of the substrate 210 is captured. FIG. 5 schematically illustrates the captured first image 410.

As shown in the first image 410 of FIG. 5, the semiconductor wafer 100 has a local substrate 210, and a plurality of conductive structures 215 within the substrate 210. In FIG. 5, the conductive structures 215 are exposed from a top surface 211 of the substrate 210.

On the first image 410 shown in FIG. 5, the conductive structures 215 are arranged in rows parallel to each other, and the conductive structures 215 extends along the rows. The conductive structures 215 in one of the rows extend along the same direction and are arranged at the same interval roughly.

To form memory units of the DRAM array 200, in this embodiment, each of the conductive structures includes a transistor within the substrate 210 and a metal contact connected to the transistor and exposed from the top surface 211 of the substrate 210. In details, please refer to the following FIG. 10 later.

The first image 410 is captured by an electron microscope. In this embodiment, the electron microscope use to capture the first image 410 is a scanning electron microscope, so that the small size conductive structures 215 can be captured to the first image 410.

During capturing the first image 410, the location in which the substrate 210 is located can be defined as a standard position. Since the standard position is determined, the substrate 210 is able to move back to the standard position after the substrate 210 is moved to be processed. It is easy to accurately move to the measurement standard position of the wafer since the current electronic microscope has high mechanical precision.

In some embodiments, the standard positon of the substrate 210 can be defined by the measuring marks 120, so that the substrate 210 is able to move back to the standard position according to the measuring marks 120.

Proceed to operation 330 and refer to FIG. 6, the reference frames RF1 and RF2 are marked on the first image 410.

In this embodiment, two reference lines RL are marked on the first image 410 first. The two reference lines RL extend across conductive structures 215 on the top surface 211 of the substrate 210, and a direction in which the two reference lines RL extend is perpendicular to the direction in which the conductive structures 215 extend. According to the two reference lines RL, reference frames RF1 and RF2 are marked on the first image 410.

Proceed to operation 330 and refer to FIG. 7A, first marks 4151 and 4152 are marked on the first image 410. In FIG. 7A, two first marks 4151 and 4152 are schematically illustrated. The two first marks 4151 and 4152 are marked on the first image 410 based on the reference frames RF1 and RF2, respectively.

As shown in FIG. 7A, the first mark 4151 is a circle beyond the reference frame RF1, the first mark 4152 is a circle beyond the reference frame RF2, so that the first marks 4151 and 4152 are corresponding to different characters of the different conductive structures 215.

The first marks shown in FIG. 7A correspond to the profile of the conductive structures 415. In some embodiments, the first marks can be corresponding to boundaries or the shapes of the conductive structures 415.

FIGS. 5-7A illustrates the case that the first image 410 includes the first marks corresponding to the exposed conductive structures 215. FIG. 7B illustrates another first image 410' including another kind of the first marks corresponding to the exposed conductive structures 215.

As shown in FIG. 7B, the first image 410' is a processed top view. The conductive structures 215 are formed on the top surface 211 of the substrate 210. In the first image 410', each conductive structure 215 is a block, which includes the area of a reference frame and a corresponding first mark of the first image 410 shown in FIG. 7A. Therefore, a plurality of first marks 415 corresponding to the conductive structure 215 can be marked on the first image 410'. For the purpose of description, only one of the first marks 415 is marked on the first image 410', which has an area including the reference frame and the first mark of the first image 410.

Return to FIG. 4. In operation 350, form a capping layer 230 on the substrate 210, and the capping layer 230 has a plurality of capacitor openings used to be aligned with the conductive structures 215 on the substrate 210.

Proceed to operation 360 after forming the capping layer 230 over the substrate 210, the substrate 210 is moved to the standard position defined in pervious operation 320. After the substrate 210 moves back to the standard position, a second image 420 of the substrate 210 with the capping layer 230 is captured.

In this embodiment, the second image 420 is captured by a scanning electron microscope. For the captured second image 420, please refer to FIG. 8.

FIG. 8 illustrates the second image 420, which includes the substrate 210 and the capping layer 230 formed on the substrate 210. Since the substrate 210 is covered by the capping layer 230. The capping layer 230 includes capacitor openings 235 exposing the conductive structures 230. If the capacitor openings 235 are not aligned with the conductive structures 215, a part of each conductive structure 215 would be covered by the capping layer 230.

Since the substrate 210 is covered by the capping layer 230, it is difficult to have position offsets between the conductive structures 215 and the capacitor openings 235 directly. However, the position of the conductive structures 215 can be obtained through the first marks 4151 and 4152, and the position offsets between the conductive structures 215 and the capacitor openings 235 can be obtained by marking the first marks of the first image 410 on the second image 420.

Proceed to operation 370 and also refer to FIG. 8, second marks corresponding to the capacitor openings 235 are identified on the second image 420. For the purpose of description, only two second marks 4251 and 4252 of the second marks are marked on the second image 420.

In some embodiments, the second marks 4251 and 4252 are identified through a pattern recognition process. The pattern recognition process can be realized by a computing system. The second marks 4251 and 4252 correspond to the profiles of the capacitor openings 135. Specifically, the second marks 4251 and 4252 can be regarded as the boundaries of the capacitor openings 235. In some embodiments, the second marks marked on the second image can be corresponding to the shapes of the conductive structures 215.

Proceed to operation 380 and also refer to FIG. 8, compare the first marks 4151 and 4152 with the second marks 4251 and 4252 respectively to have position offsets. In this embodiment, since the substrate 210 has been moved to the standard position in the first image 410 before the second image 420 is captured, it is possible to compare the first marks 4151 and 4152 in the first image 410 with the second marks 4251 and 4252 in the second image 420 directly.

In operation 380, in this embodiment, the mentioned first marks 4151 and 4152 are marked on the second image 420. First, the reference frames RF1 and RF2 are marked on the second image 420. Then, the first marks 4151 and 4152 are marked on the second image 420 based on the reference frames RF1 and RF2.

Therefore, both the first mark 4151 and the corresponding second mark 4251 are marked on the second image 420. As shown in FIG. 8, the first mark 4151 corresponds to the second mark 4251, and the first mark 4151 is enclosed by the second mark 4251. Therefore, it could be considered that the capacitor opening 235 corresponding to the second mark 4251 is aligned with the conductive structure 215 corresponding to the first mark 4151. However, for the first mark 4152 and the corresponding second mark 4252, a part of the first mark 4152 is beyond the corresponding second mark 4252. As such, a position offset between the capping layer 230 and the substrate 210.

FIG. 8 illustrates only two pairs of first mark and the second mark. Generally, a plurality of position offsets between the first marks and the second marks could be obtained, so that the apparatus used to form the capping layer 230 could receive the position offsets to adjust parameters of forming the capping layer 230.

Figure 9A:
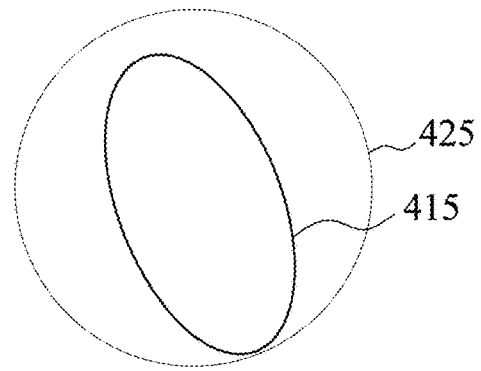
FIGS. 9A and 9B illustrate comparison of the first marks and the second marks.
Figure 9B:
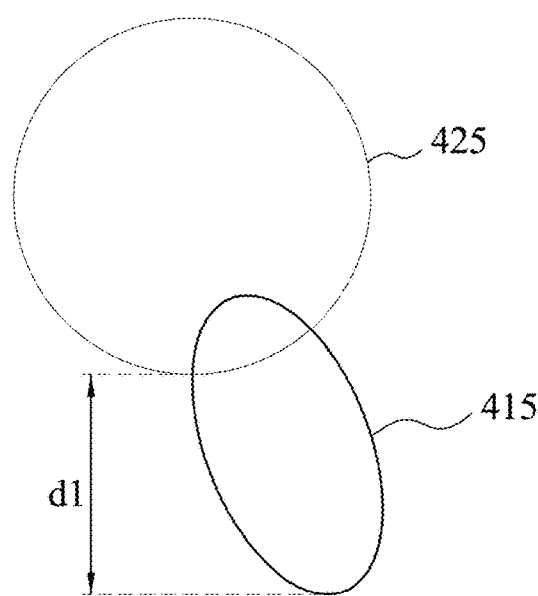

FIGS. 9A and 9B illustrate comparison of the first marks 415 and the second marks 425. For the purpose of simplified description, each of FIGS. 9A and 9B illustrates only one of the first marks 415 and the corresponding one of the second marks 425.

In FIG. 9A, the first mark 415 is enclosed by the second mark 425. In this case, the capacitor opening 235 corresponding to the second mark 425 is aligned with the conductive structure 215 corresponding to the first marks 415.

As a comparison, a portion of the first mark 415 is beyond the second mark 425 in FIG. 9B. Therefore, a position offset d1 is between the capacitor opening 235 corresponding to the second mark 425 and the conductive structure 215 corresponding to the first marks 415, and the capacitor opening 235 is not aligned with the conductive structure 215. A fixing for the apparatus used to form the capping layer 230 with the capacitor openings 235 is required to reduce the position offset d1.

In some embodiments, the substrate 210 can be regarded as a test substrate, and the capping layer 230 can be regarded as a test capping layer, and the position offset between the test substrate and the test capping layer can be obtained to fix manufacturing parameters of the apparatus used for forming the capping layer 230. After the apparatus is fixed according to position offset, the semiconductor structure (e.g. the DRAM array) can be manufacturing by the fixed apparatus, and the capacitor openings 235 are able to be aligned with the conductive structure 210.

Specifically, after the position offset fixed according to the method 300, an addition substrate with exposed conductive structures can be provided in the mentioned standard position and an addition capping layer is formed over the addition substrate. The addition capping layer is provided by an apparatus used to form the test capping layer (i.e. the capping layer 230) shown in FIGS. 3-8. The position offset is received by the apparatus, so that capacitor openings of the addition capping layer are respectively aligned with the conductive structures exposed from a top surface of the addition substrate. The capacitor openings extend along a first direction perpendicular to a second direction in which the top surface of the substrate extends.

For the addition substrate and the addition capping layer, capacitors are formed in the capacitor openings of the addition capping layer, so that the formed capacitors within the addition capping layer are aligned with the conductive structure of the addition substrate since the apparatus used to form the capping layer has been fixed according to the position offset obtained from the stacking test substrate and the test capping layer.

Figure 10:
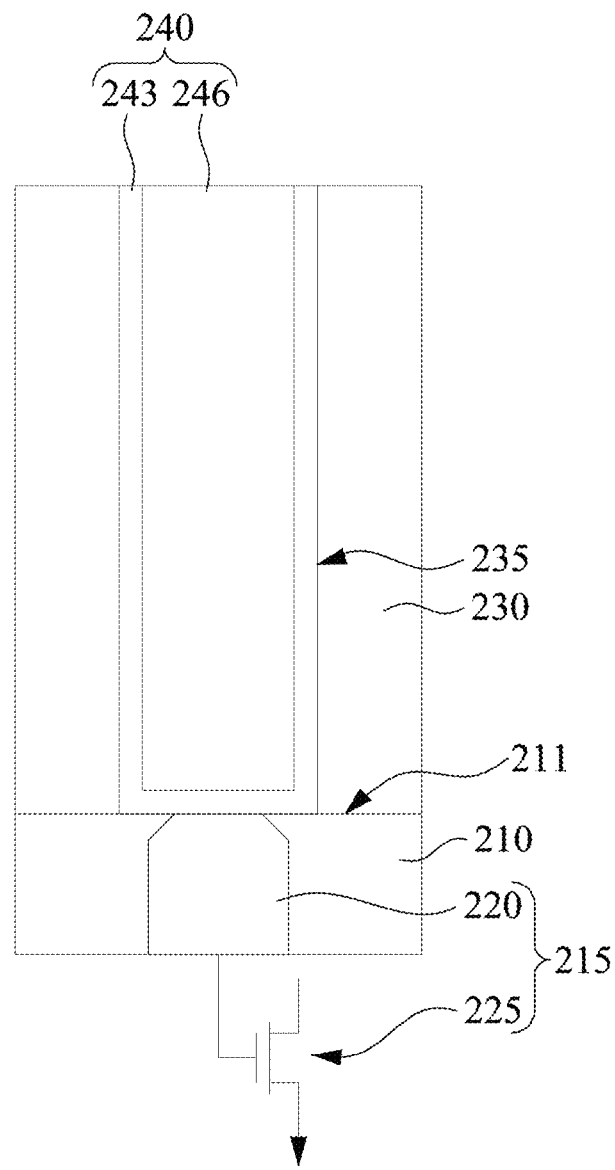
FIG. 10 illustrates a cross-section view of a capacitor aligned with a conductive structure according to one embodiment of the present disclosure.

Reference is made in FIG. 10. FIG. 10 illustrates a cross-section view of a capacitor 240 aligned with a conductive structure 215 in the addition substrate according to one embodiment of the present disclosure. Similar elements would be with similar labels.

As shown in FIG. 10, a capacitor 240 is formed within a capacitor opening 235 of the capping layer 230 through fixing based on the position offset between the test capping layer and the test substrate in FIG. 8.

In FIG. 10, the conductive structure 215 includes an active area within the substrate 210 and a metal contact 220 connected to the active area and exposed from the top surface 211 of the substrate 210. In this embodiment, the active area includes a transistor 225 formed within the substrate 210 and connected to the metal contact 220.

Therefore, the transistor 225 is connected to the capacitor 240 to form a memory unit of a DRAM array. Similar to FIG. 1, in some embodiments, the DRAM array can be surrounded by streets, and a plurality of measuring marks are located in the streets.

In some embodiments, material of the capping layer 230 includes dielectric material.

As shown in FIG. 10, the capacitor opening 235 is aligned with the conductor structure 215 formed within the addition substrate 210. Specifically, in this embodiment, the capacitor opening 235 is aligned with the metal contact 220. The capacitor opening 235 extends along a direction perpendicular a direction in which the top surface 211 of the addition substrate 210. As such, the capacitor 240 is formed along the capacitor opening 235 and extends along the direction in which the capacitor opening 235 extends.

In this embodiment, the capacitor 240 includes a dielectric container 243 and a conductive material 246. As shown in FIG. 10, the dielectric container 243 is formed within the capacitor opening 235, thereby covering the metal contact 210, which is the exposed portion of the conductive structure 215 on the top surface 211 of the substrate 210. The conductive material 246 is filled with the dielectric container 243.

In summary, position offset between the conductive structures and the capping layer can be obtained through the measuring method of the present disclosure, and the position offset can be further used to fix the error of the apparatus forming the capping layer. After fixing the error of the apparatus, a semiconductor structure with conductive structures and corresponding capping layer with aligned opening can be provided. Therefore, the electrical properties of the DRAM array can be improved.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A method of semiconductor overlay measuring, comprising:

providing a test substrate, wherein a plurality of conductive structures are disposed in the test substrate and exposed from a top surface of the test substrate;

positioning the test substrate to a standard position and capturing a first image of the top surface of the test substrate;

marking a plurality of first marks on the first image, wherein the first marks are direct to the exposed conductive structures within the test substrate in the first image;

after the first image is captured, forming a test capping layer on the top surface of the test substrate, wherein the test capping layer has a plurality of capacitor openings;

moving the test substrate to the standard position and capturing a second image of a top surface of the test capping layer;

identifying the capacitor openings on the second image with a plurality of second marks; and comparing the first marks with the second marks to determine a position offset between the test substrate and the test capping layer.

2. The method of claim 1, wherein the first marks correspond to profiles of the exposed conductive structures on the test substrate, and the second marks correspond to profiles of the capacitor openings.

3. The method of claim 1, wherein the first and second images are captured by an electronic microscope.

4. The method of claim 1, wherein the second marks are identified through a pattern recognition process.

5. The method of claim 1, wherein the exposed conductive structures are arranged in rows extending along a first direction, the rows are arranged in a second direction perpendicular to the first direction, the marking the first marks on the first image further comprise:

marking reference frames arranged on a straight line along one of the first and second directions; and marking the first marks according to the reference frames.

6. The method of claim 5, wherein the comparing the first marks with the second marks comprises:

marking the reference frames on the second image; and marking the first marks on the second image according the reference frames.

7. The method of claim 1, wherein the conductive structures are surrounded by streets, and a plurality of measuring marks are located in the streets.

8. The method of claim 7, wherein the standard position of the test substrate is defined by the measuring marks.

9. A method of semiconductor structure manufacturing, comprising:

processing the method of claim 1 to have the position offset; and providing a substrate with exposed conductive structures in the standard position and forming a capping layer over the substrate, wherein the capping layer is provided by an apparatus used to form the test capping layer, the position offset is received by the apparatus, so that capacitor openings of the capping layer are respectively aligned with the conductive structures exposed from a top surface of the substrate, and the capacitor openings extend along a direction perpendicular to the top surface of the substrate.

10. The method of claim 9, wherein each of the conductive structures of the substrate comprising an active area within the substrate and a metal contact connected to the active area and exposed from the top surface of the substrate.

11. The method of claim 9, wherein the capping layer comprises dielectric material.

12. The method of claim 9, wherein the conductive structures on the substrate are surrounded by streets, and a plurality of measuring marks are located in the streets.

13. The method of claim 9, further comprising:

forming capacitors in the capacitor openings of the substrate, wherein the capacitors extend along the direction in which the capacitor openings extend.

14. The method of claim 13, wherein each of the capacitors comprises:

a dielectric container formed within a corresponding one of the capacitor opening and covering a corresponding one of the exposed conductive structures of the substrate; and a conductive material filled with the dielectric container.

15. The method of claim 14, wherein the conductive structures comprise transistors, the capacitors are connected to the transistor respectively to form memory units.

* * * * *